United States Patent [19]

Mounoussamy et al.

[11] Patent Number: 5,211,757
[45] Date of Patent: May 18, 1993

[54] DEVICE FOR POSITIONING MASKING STRIPS IN A METALLIZING MACHINE

[75] Inventors: Joël Mounoussamy, Beaune; Jean-Paul Bouchard, Chateaurenaud; Thierry Feral, Jallanges, all of France

[73] Assignee: Thomson - CSF, Puteaux, France

[21] Appl. No.: 695,553

[22] Filed: May 3, 1991

[30] Foreign Application Priority Data

May 11, 1990 [FR] France ................................. 90 05904

[51] Int. Cl.$^5$ ............................................. D03C 13/00
[52] U.S. Cl. ..................................... 118/504; 118/718
[58] Field of Search ............... 118/718, 504, 213, 301, 118/406; 156/554; 198/817

[56] References Cited

U.S. PATENT DOCUMENTS

| | | | |
|---|---|---|---|
| 407,724 | 7/1889 | Davis | 198/817 |
| 2,759,594 | 10/1956 | Kleboe et al. | 198/817 |
| 2,957,572 | 10/1960 | Dvorak | 198/817 |
| 3,598,226 | 10/1971 | Hayman | 198/817 |
| 3,866,565 | 2/1975 | Rideout | 118/504 |
| 3,941,646 | 3/1976 | Petry, Jr. et al. | 156/555 |

FOREIGN PATENT DOCUMENTS

| | | | |
|---|---|---|---|
| 2744147 | 4/1979 | Fed. Rep. of Germany | |
| 1261471 | 11/1986 | Japan | 118/504 |
| 3073654 | 4/1988 | Japan | 118/504 |
| 8700208 | 1/1987 | World Int. Prop. O. | |

Primary Examiner—W. Gary Jones
Assistant Examiner—Brenda Lamb
Attorney, Agent, or Firm—Roland Plottel

[57] ABSTRACT

A device for positioning at least one masking strip in a machine for metallizing wide film, enabling a film to be obtained with metallized zones and non-metallized zones. This device has at least two rollers with smooth surfaces which drive the masking strips, and are positioned to bring the masking strips over the film during the metallization. At least one comb is mounted near the metallization site to position and guide the masking strips over the film. The invention applies to machines for metallizing plastic films used, for example, in the manufacture of chip-type capacitors.

12 Claims, 1 Drawing Sheet

DEVICE FOR POSITIONING MASKING STRIPS IN A METALLIZING MACHINE

BACKGROUND OF THE INVENTION

The present invention concerns a device for positioning masking strips in a metallizing machine, notably a machine for metallizing wide dielectric film giving a film with metallized zones and non-metallized zones.

At present, to manufacture capacitors with metallized dielectric film of stacked or rolled type, plastic films are used which have a metallized zone and a lateral non-metallized margin. These metallized flexible plastic films with a non-metallized margin are obtained using a process in two stages. During the first stage, a wide flexible dielectric film such as a polyester, polycarbonate. polysulfone, polypropylene or similar film is metallized by a process of evaporation under vacuum in a metallizing machine. The metallization is performed by evaporating a metal such as aluminium, zinc, alloys containing aluminium, zinc, chrome or similar. The non-metallized margins are obtained during the process of evaporation under vacuum, by using a set of masking strips enabling non-metallized parts to be obtained on the wide film. In metallizing machines used at present, the device for positioning the masking strips is constituted of several grooved rollers which drive the masking strips. This device has a number of disadvantages. It requires a set of at least two rollers, more often three or four, with grooves of the same width. In addition, it is necessary to have a set of rollers for each width of masking strip. Moreover the positioning of the rollers inside the metallizing machine is often a long and complex task since it is necessary to remove and replace several rollers each time a film with non-metallized zones of different width is required.

SUMMARY OF THE INVENTION

The aim of the present invention is therefore to remedy these disadvantages by proposing a new device for positioning the masking strips in a metallizing machine for wide film.

Consequently, the object of the present invention is a device for positioning at least one masking strip in a machine for the metallization of wide film making it possible to obtain a film with metallized zones and non-metallized zones, characterized by the fact that it is constituted of at least two rollers with a smooth surface for driving the masking strips, the driving rollers being positioned to bring the masking strips over the film during the metallization, and of at least one fixed comb for positioning and guiding the said strips The fixed comb is preferably placed before the actual site of metallization. This enables the masking strips to be positioned with great precision in such a way as to obtain, after metallization and cutting, a metallized plastic film whose widths are constant within very tight tolerances.

Preferably, according to another characteristic of the present invention, the positioning device in addition includes a pre-guide comb which enables the positioning of the masking strips to be perfected.

According to another characteristic of the present invention, each comb possesses a row of teeth, the notches between the teeth having a width identical to that of the masking strips, so as to obtain non-metallized zones with constant widths.

According to yet another characteristic, each comb is provided with two rows of teeth positioned symmetrically with respect to each other, the notches of each row having different widths to adapt to films with metallized and non-metallized zones of different widths or of different pitches. This makes it possible to reduce the number of different combs and facilitates their mounting.

According to a preferred embodiment, each comb is made of a material which is stable at the temperatures and/or pressures prevailing in the metallizing machine. Each comb is preferably made of 36% Ni, 0.03% C, 0.02% Si, 0.03% Nn, balance Fe, type steel, sold under the trademark "INVAR" manufactured by Metalimphy, 75009 Paris, France.

The use of such a material gives combs which are dimensionally stable at temperatures and pressures ($10^{-2}$ to $10^{-3}$ Pa) prevailing in common metallizing machines.

BRIEF DESCRIPTION OF THE DRAWINGS

Other characteristics and advantages of the present invention will appear on reading the description of a preferred but not restrictive embodiment, which make reference to the appended drawings.

DESCRIPTION OF THE PREFERRED EMBODIMENT

Figure 1:
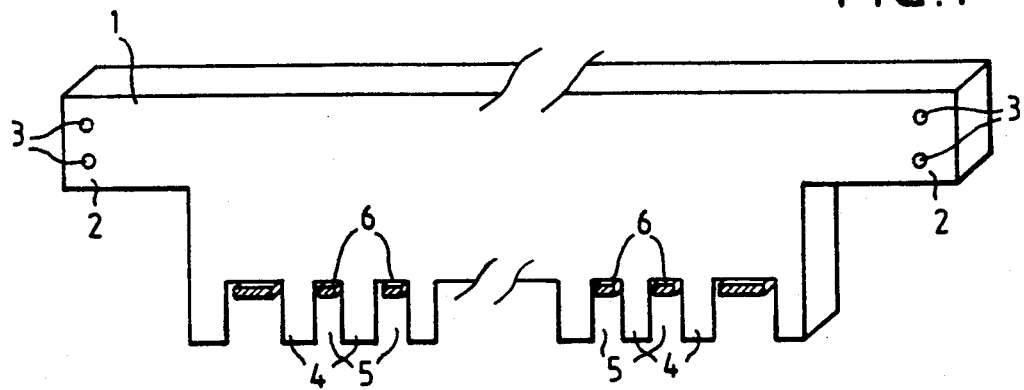
FIG. 1 is a view of a comb according to the invention.

FIG. 1 gives a diagrammatic perspective view of a mode of embodiment of a comb according to the present invention. This comb has two fixing arms 2 each provided with two holes 3 for the passage of means of fixing, such as threaded rods, onto a support. As shown in FIG. 1, the central part of the comb 1 is provided on one side with teeth 4 of specific width 1, these teeth being separated from each other by notches 5 in which are placed masking strips as represented in section by the reference 6. In this case, the notches 5 are of width 1' approximately identical to the width of the masking strips 6. This width is equal to twice the non-metallized margin, if the films obtained using the comb are used to manufacture metallized plastic film capacitors and notably capacitors of chip type. In this case, the width 1' of the notches, i.e. the width of the strips, may be of the order of 0.5 mm.

Figure 2:
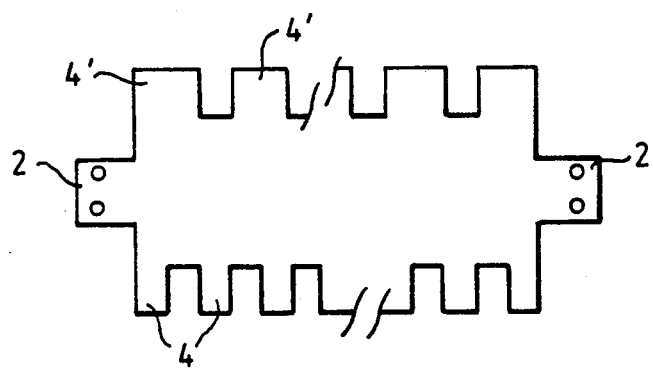
FIG. 2 is a plan view of another mode of embodiment of a comb according to the invention.

According to a variant embodiment represented in FIG. 2, the comb may have teeth 4 and 4' on each side of the central part joining the arms 2. In this case, the teeth and the notches on each side have different widths so that they can be used to manufacture metallized films with metallized zones and non-metallized zones with different dimensions depending on their final use. The teeth and the notches may also have a different pitch. This makes it possible to limit the total number of combs required to manufacture a given range of products.

The combs described above are used in a machine for metallization under vacuum. They are therefore made of a material which is not deformed at the temperatures and pressures prevailing in such machines ($10^{-2}$ to $10^{-3}$ Pa). They are preferably made of "INVAR" steel.

Figure 3:
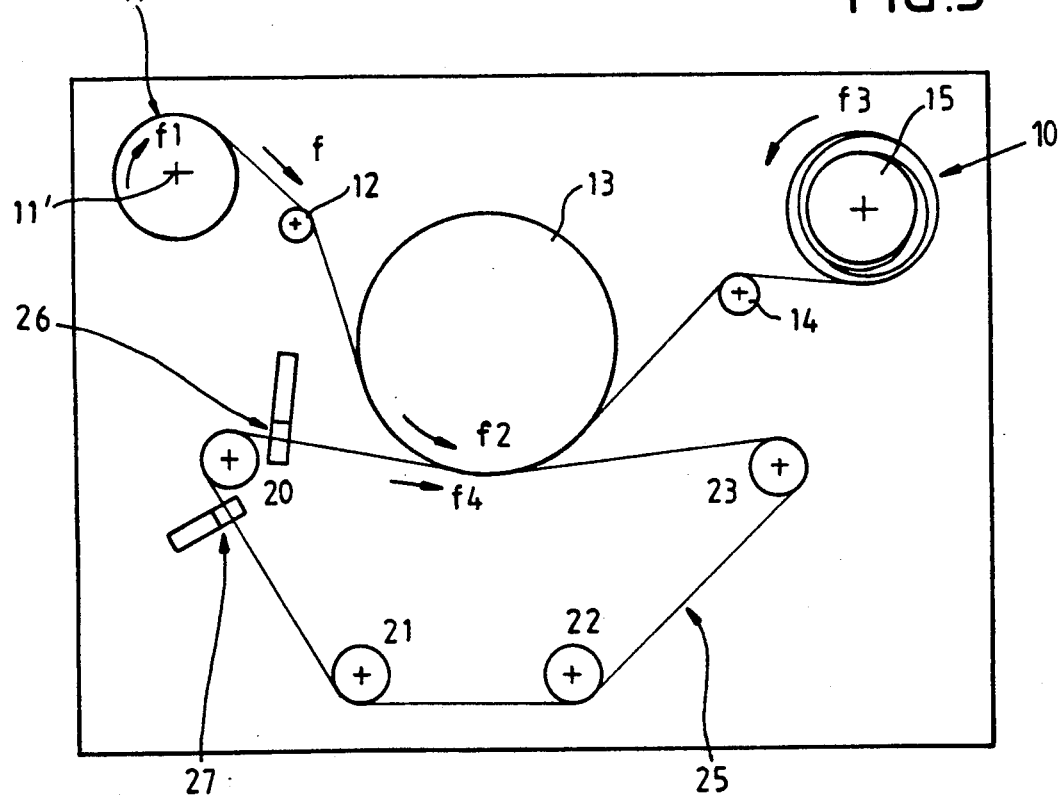
FIG. 3 is a diagram showing the positioning of the comb in a machine of common type for metallizing wide film.

We shall now give a brief description with reference to FIG. 3 of a mode of embodiment of a vacuum metallization machine equipped with a device for positioning masking strips using at least one comb according to the present invention. As represented in FIG. 3, in a container under vacuum 10, we find basically a first spool known as the parent spool mounted on a spindle 11'. This parent spool is constituted of a bare dielectric film such as a polyester, polycarbonate, polysulfone, polypropylene or similar film. This is a wide film, for example of width 515 mm. As represented in FIG. 3, the film coming from the parent spool 11 unrolls in the direction shown by the arrow f and is driven by a roller 12 towards a wheel 13 maintained at a temperature of −30° C. against which the metallization by evaporation under vacuum takes place. Then the film, held taut by the roller 14, is wound onto a reel 15 on which it is stored for later processing. As represented in FIG. 3, the various spools and wheels 11, 13, 15 rotate in the direction shown by the arrows f1, f2, f3.

According to the present invention, the metallizing machine 10 described above is equipped with a device for positioning the masking strips enabling a metallized film to be obtained with metallized and non-metallized zones. The device for positioning the masking strips is constituted, in the mode of embodiment shown, by four rollers 20, 21, 22, 23 for guiding and driving the masking strips. A strip 25 is shown in FIG. 3. This strip is driven in the direction of the arrow f4. It is preferably made of a plastic material, such as that sold under the brand-name "KAPTON". In accordance with the present invention, the rollers 20, 21, 22, 23 have a smooth surface, unlike the rollers used previously which each had guide grooves. The rollers 20, 21, 22, 23 are therefore fixed permanently in the metallizing machine. Moreover, according to the present invention, the positioning device comprises two combs 26, 27 for guidance and pre-guidance of the various masking strips 25. These combs are shaped either as shown in FIG. 1 or as in FIG. 2. In fact, the comb 27 positioned just before the roller 20, i.e. the roller before the place where the masking strips come into contact with the film to be metallized at the site of metallization, is a pre-guide comb enabling initial approximate positioning of the masking strips. The comb 26 positioned just after the roller 20, i.e. just before the site of metallization, is a guide comb enabling exact positioning of the masking strips with respect to the film to be metallized coming from the spool 11. The use of such a guiding device for the masking strips has a number of advantages which were mentioned in the introduction to the present application. Notably, when a new film is to be metallized with a different width of metallized and non-metallized zones, only the guide combs need be modified since the rollers driving the masking strips 20, 21, 22, 23 have a smooth surface. This enables the machine to be made ready for use much more quickly than with present devices. Moreover, the use of a guide comb 26 enables very precise positioning of the masking strips, which means that after metallization and a later cutting stage, a metallized plastic film is obtained whose widths are constant within very precise tolerances. For example, this makes it possible to manufacture metallized plastic films used in chip-type capacitors with a film width of 2.5 mm and a margin width of 0.25 mm.

In addition, the use of a comb such as that described above enables a wide film to be metallized using as many guided masking strips as necessary. It is possible to make combs which can guide simultaneously more than 100 masking strips.

It is clear to the professional that different modifications may be made to the device for positioning masking strips described with reference to FIG. 3, notably as regards the number of smooth rollers used to drive the masking strips which must be at least equal to two and as regards the number of combs which must be at least equal to one.

What is claimed is:

1. Device for positioning a plurality of individual closed loop masking strips in a machine for metallizing wide film with narrow width metallized zones and non-metallized zones, comprising at least two rollers with a smooth surface which drive the masking strips, these driving rollers being positioned so as to bring the masking strips over the film during metallization, and at least one fixed comb engaging said strips for positioning and guiding the masking strips over the film.

2. Device according to claim 1, wherein the fixed comb is placed before a site of metallization.

3. Device according to claim further comprising a pre-guide comb, placed before said one comb.

4. Device according to claim 2 or 3, wherein the fixed comb or each comb is equipped with a row of teeth and notches between the teeth, said notches having a width identical to that of the masking strips.

5. Device according to claim 2 or 3, wherein the fixed comb or each comb is equipped with two rows of teeth and notches between the teeth, said rows of teeth being positioned symmetrically with respect to each other, the notches of each row having different widths which are structured and arranged to receive strips of different widths, whereby there is provided films with metallized and non-metallized zones of different widths.

6. Device according to claim 5, wherein each comb is made of a material stable at the temperature and/or pressures prevailing in the metallizing machine.

7. Device according to claim 6, wherein each comb is made of a Fe-Ni alloy steel having approximately 36% Ni.

8. An apparatus for metallizing dielectric films comprising
a first roller,
a second roller,
a plurality of bands mounted on and extending between said roller with one band next to another, and with predetermined spaces between the bands,
a comb having teeth and notches between said teeth positioned to engage said bands between said rollers with the bands in the inter-tooth notches, and said notches being of the same width as the bands passing therein, and said teeth being as wide as predetermined spaces between said adjacent bands, whereby said bands are precisely positioned with respect to each other, as said rollers and bands move relative to one another, and
a printing position adjacent to said bands and in printing contact with said bands, comprises a metallization site at which a dielectric film to be metallized moves adjacent to said bands, as a metal is condensed on said dielectric film in the spaces between said bands, and as bands and dielectric film move past said site, and wherein said comb is placed in a position before said site and after the roller which is before said site.

9. An apparatus according to claim 8 further comprising another comb with similar tooth notch spacing as said comb and positioned before said roller which is before said site, and also engaging said bands in said notches.

10. An apparatus according to claims 8 or 9, wherein at least two of said teeth are of different widths and the metal condensed on said moving dielectric films is of different widths respectively.

11. An apparatus according to claim 8 where in at least two of said teeth are of different widths.

12. An apparatus according to claim 8 wherein said bands are approximately 0.5 millimeters wide.

* * * * *